United States Patent
Oura et al.

(10) Patent No.: US 11,561,121 B2
(45) Date of Patent: Jan. 24, 2023

(54) COMPOSITION RATIO ESTIMATION DEVICE/ COMPOSITION RATIO ESTIMATION METHOD/ COMPOSITION RATIO ESTIMATION PROGRAM/ AND LIQUID LEVEL GAUGE

(71) Applicant: MUSASINO CO., LTD., Tokyo (JP)

(72) Inventors: Hideto Oura, Tokyo (JP); Akihiro Muraishi, Tokyo (JP)

(73) Assignee: MUSASINO CO., LTD, Tokyo (JP)

( * ) Notice: Subject to any disclaimer, the term of this patent is extended or adjusted under 35 U.S.C. 154(b) by 797 days.

(21) Appl. No.: 16/509,684

(22) Filed: Jul. 12, 2019

(65) Prior Publication Data
US 2020/0072652 A1 Mar. 5, 2020

(30) Foreign Application Priority Data

Sep. 4, 2018 (JP) .............................. JP2018-165138

(51) Int. Cl.
| | |
|---|---|
| *G01F 23/284* | (2006.01) |
| *G01N 27/22* | (2006.01) |
| *G01F 23/80* | (2022.01) |
| *G01R 27/26* | (2006.01) |

(52) U.S. Cl.
CPC .......... *G01F 23/284* (2013.01); *G01F 23/804* (2022.01); *G01N 27/221* (2013.01); *G01N 2027/222* (2013.01); *G01R 27/2623* (2013.01)

(58) Field of Classification Search
CPC .... G01F 23/284; G01F 23/00; G01F 23/0076; G01F 23/804; G01N 27/22; G01N 27/221
USPC .............................................. 73/1.73
See application file for complete search history.

(56) References Cited

U.S. PATENT DOCUMENTS

| | | | | |
|---|---|---|---|---|
| 5,987,907 | A * | 11/1999 | Morimoto | F25B 41/24 62/502 |
| 10,012,003 | B1 * | 7/2018 | Des Champs | E04H 4/1254 |
| 10,271,766 | B1 * | 4/2019 | Parker, Jr. | A61B 5/0836 |
| 2001/0014420 | A1 * | 8/2001 | Takeuchi | H01M 8/1067 428/425.5 |

(Continued)

FOREIGN PATENT DOCUMENTS

| | | |
|---|---|---|
| JP | 59-27252 A | 2/1984 |
| JP | 2005-98825 A | 4/2005 |
| JP | 2014-32059 A | 2/2014 |

*Primary Examiner* — Eric S. McCall
*Assistant Examiner* — Mohammed E Keramet-Amircolai
(74) *Attorney, Agent, or Firm* — WCF IP

(57) ABSTRACT

A composition ratio estimation device estimates a composition ratio of a content having mixed substances with different boiling points in a tank. The content is retained as a liquid in the tank lower part. The substances are partially floatable as a gas or liquid in a space in the tank upper part. The device includes a reference object disposed in the space, a transmitting-receiving unit that transmits radar waves toward the reference object and the surface of the liquid and receives reflected radar waves, a temperature measuring unit that acquires a level at which a boiling point of a floating substance is reached, a dielectric constant calculating unit that stores in advance a physical distance between the unit and the object and calculates a dielectric constant of a space between the unit and the object, and a composition ratio derivation unit that derives a composition ratio of the liquid.

13 Claims, 3 Drawing Sheets

(56) References Cited

U.S. PATENT DOCUMENTS

| | | | |
|---|---|---|---|
| 2009/0024304 A1* | 1/2009 | Takubo | F02D 19/088 |
| | | | 701/103 |
| 2009/0277806 A1* | 11/2009 | Hamamoto | G01N 27/4075 |
| | | | 205/781 |
| 2009/0282892 A1* | 11/2009 | Sai | G01F 23/284 |
| | | | 73/1.73 |
| 2012/0056774 A1* | 3/2012 | Wennerberg | G01F 25/20 |
| | | | 342/124 |
| 2012/0234074 A1* | 9/2012 | Hagen | G01F 23/804 |
| | | | 73/1.73 |
| 2013/0269414 A1* | 10/2013 | Ferraro | G01F 23/2967 |
| | | | 73/1.73 |
| 2017/0010143 A1* | 1/2017 | Kassubek | G01S 13/878 |
| 2018/0087573 A1* | 3/2018 | Lannello | F16C 32/0614 |
| 2018/0104644 A1* | 4/2018 | Cox, Jr. | B01D 53/96 |
| 2018/0172625 A1* | 6/2018 | Ichikawa | G01N 27/4075 |

* cited by examiner

COMPOSITION RATIO ESTIMATION DEVICE/ COMPOSITION RATIO ESTIMATION METHOD/ COMPOSITION RATIO ESTIMATION PROGRAM/ AND LIQUID LEVEL GAUGE

BACKGROUND

Technical Field

The present invention relates to a composition ratio estimation device, a composition ratio estimation method, a composition ratio estimation program, and a liquid level gauge using the composition ratio estimation device.

Related Art

There is known a liquid level gauge that measures the level of a liquid surface in a tank retaining a content, such as a liquid.

In electric wave liquid level gauges, a radar signal transmitted from a transmitter-receiver module is transformed into an electromagnetic wave, i.e., a radar wave, by a transducer. The radar wave is propagated toward the liquid surface, reflected off the liquid surface, and then reversely transformed into a radar signal by the transducer. The transmitter-receiver module estimates the level of the liquid surface based on the reversely transformed radar signal.

In the liquid level gauge that calculates the liquid level based on the radar wave reflected off the liquid surface, radar waves are propagated through a space above the liquid. In the space above the liquid, there are vaporized components of the content and floating liquid components other than the liquid retained below. The dielectric constant of the space above the liquid is determined by the composition ratio of the content. Therefore, in the case in which a content whose composition ratio is unknown is retained, its composition ratio has to be analyzed beforehand, which is complicated.

Therefore, there is a need for a composition ratio estimation device that automatically estimates the composition of a content retained in a tank.

JP 2005-098825 A discloses a detection method for functional water in which a sample is sealed in a liquid holder, the thickness of an air layer of the liquid holder is made constant, a laser beam in the far infrared band is transmitted through the liquid holder, and the absorbed amount is measured. Since this detection method is a method that estimates whether the liquid is functional water based on the dielectric constant of a sample in a predetermined amount, JP 2005-098825 A has the object that is different from an object of the invention of the present application that is to estimate the amount of a liquid.

JP S59-27252 A discloses an oil mist concentration measurement device that measures the concentration of oil mist floating in the cylinder of a Stirling engine based on a change in electromagnetic waves applied to the space in the cylinder. However, this oil mist concentration measurement device is a device that measures the concentration of oil mist itself floating in the space, and is not a device that estimates the amount of a retained liquid.

JP 2014-32059 A discloses a relative dielectric constant calculation device in which radar waves under different transmission conditions are transmitted to a liquid retained in a tank, beat frequencies are extracted based on transmission frequencies and receiving frequencies under individual different conditions, and a calculation unit calculates a relative dielectric constant based on the beat frequencies extracted for the individual different transmission conditions. However, in the case in which the level of the liquid surface changes, the relative dielectric constant has to be calculated at every change, which is complicated, and the measurable range of the liquid level is limited.

SUMMARY

An object is to provide a composition ratio estimation device that highly accurately estimates the composition ratio of a content retained in a tank.

A composition ratio estimation device according to the present invention is a composition ratio estimation device that estimates a composition ratio of a content retained in the inside of a tank, the content having a plurality of substances mixed, the plurality of substances having boiling points different from each other. The content is retained as a liquid in the lower part of the inside of the tank, and at least a part of the plurality of substances is floatable as a gas or a liquid in a space in the upper part of the inside of the tank. The composition ratio estimation device includes a reference object disposed in the space, a transmitting-receiving unit configured to transmit radar waves toward the reference object and a liquid surface of the liquid and receive radar waves reflected off the reference object and the liquid surface, a temperature measuring unit configured to acquire a level at which a boiling point of a floating substance is reached for individual floating substances floating as a gas and a liquid in the space, a dielectric constant calculating unit configured to store in advance a physical distance between the transmitting-receiving unit and the reference object and calculate a dielectric constant of a space between the transmitting-receiving unit and the reference object based on the physical distance and the radar wave reflected off the reference object, and a composition ratio derivation unit configured to derive a composition ratio of the liquid based on the dielectric constant of the space between the transmitting-receiving unit and the reference object and the location of the boiling point.

According to the present invention, the composition ratio of the content retained in a tank can be highly accurately estimated.

DETAILED DESCRIPTION

In the following, embodiments of a composition ratio estimation device according to the present invention and a liquid level gauge having the composition ratio estimation device will be described with consultation of the drawings.

Composition Ratio Estimation Device (1)

Figure 1:
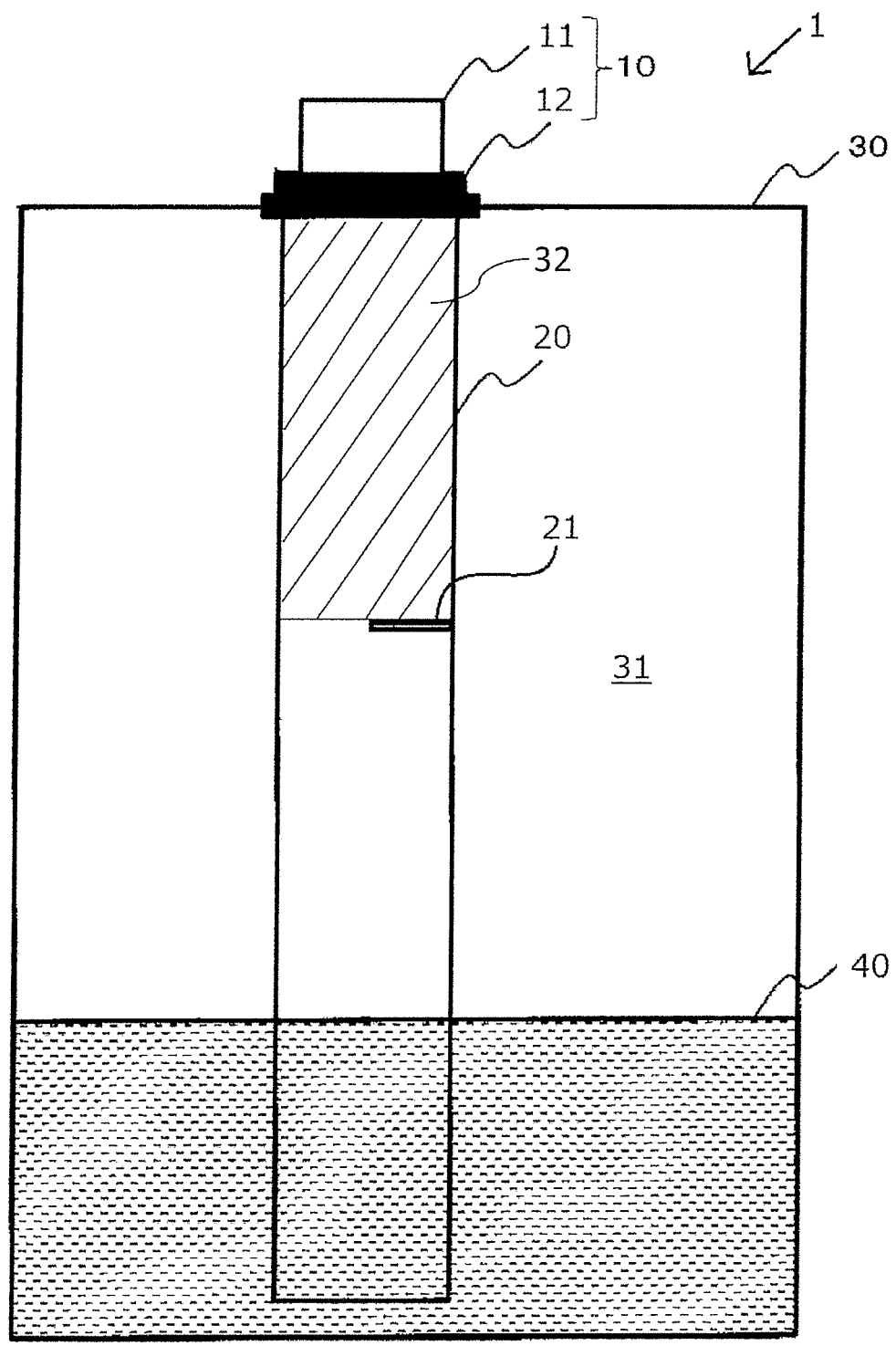
FIG. 1 is a vertical cross-sectional view showing an embodiment of a liquid level gauge having a composition ratio estimation device according to the present invention.

In FIG. 1, a liquid level gauge 1 is a device configured to measure the liquid level of a liquid, for example, that is a measured object retained in a tank 30.

The content is retained as a liquid 40 in the lower part of the tank 30. The content is a mixture, and substances contained in the content individually have different boiling points. In a space 31 located in the inside of the tank 30 and above the region where the liquid 40 is retained, at least one kind of the substances of the content mixture can have the temperature that is a boiling point. Since the retained liquid 40 has a temperature that is lower than the ambient temperature of the tank 30, the temperature of the space 31 is a relatively low temperature near the liquid 40, and the temperature rises as apart from the liquid 40 toward the upper part of the space 31. Therefore, the components of the content that float in the space 31 are present as gases in the space above the level at which the boiling point is reached, whereas the components are present as liquids in the space below the level. That is, in the space 31, a component floating as a gas (in the following, referred to as "a gas component") and a component floating as a liquid (in the following, referred to as "a liquid component") are present.

As shown in FIG. 1, the liquid level gauge 1 includes a transmitting-receiving unit 10, a waveguide 20, and a reference object 21. The transmitting-receiving unit 10 includes a transmitter-receiver module 11 and a transducer 12. The transmitter-receiver module 11 is a functional unit disposed on the top surface of the tank 30 and configured to transmit a radar signal to the transducer 12. The transducer 12 converts the radar signal into a radar wave, and emits the radar wave toward the inside of the waveguide 20.

The waveguide 20 is a cylindrical member disposed downward toward the inside of the tank 30. The top end of the waveguide 20 is connected to the transducer 12. The lower end of the waveguide 20 extends downward toward the inside of the tank 30. The liquid 40 retained in the inside of the tank 30 can enter the waveguide 20 from the lower end such that the liquid level in the inside of the tank 30 matches the liquid level in the waveguide 20. On the upper part of the waveguide 20, at least one through hole is formed to push a gas in the inside of the waveguide 20 when the liquid 40 enters the inside of the waveguide 20.

The reference object 21 is a member disposed in the inside of the waveguide 20 and configured to reflect the radar wave emitted from the transducer 12. The reference object 21 is a member radially protruding toward the inside of the waveguide 20. The reference object 21 may have a bar shape or a flat shape. The reference object 21 may be formed radially across the waveguide 20, or may have a net shape. The reference object 21 is not immersed in the liquid 40 in the state in which the content is retained in the inside of the tank 30, and the reference object 21 is measured when disposed in the space 31. Note that in the embodiment, one reference object 21 is provided. However, a plurality of reference objects may be placed at levels different from each other in the inside of the tank 30.

Figure 2:
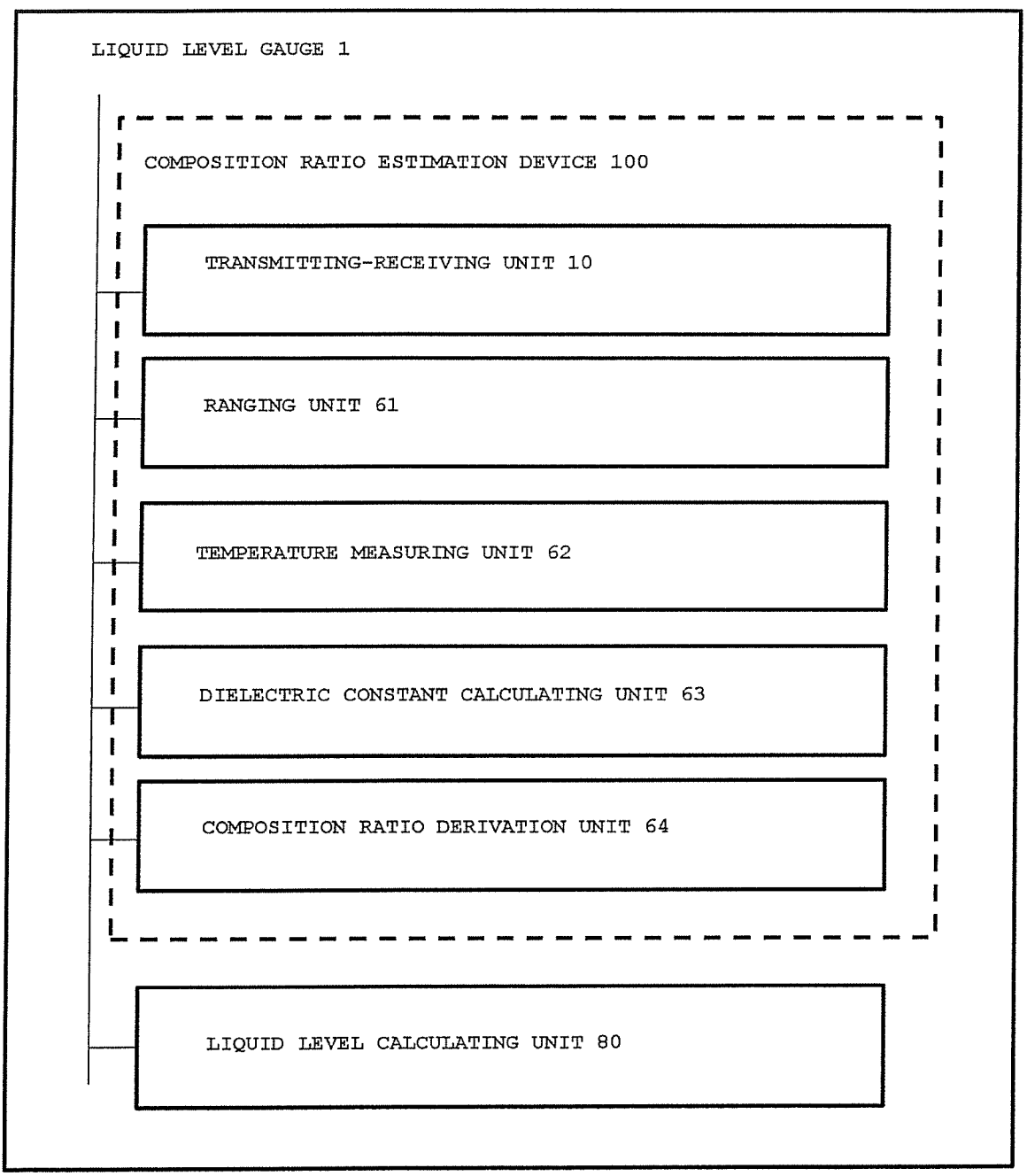
FIG. 2 is a functional block diagram showing the liquid level gauge.

As shown in FIG. 2, the liquid level gauge 1 includes a transmitting-receiving unit 10, a ranging unit 61, a temperature measuring unit 62, a dielectric constant calculating unit 63, a composition ratio derivation unit 64, and a liquid level calculating unit 80. The transmitting-receiving unit 10, the ranging unit 61, the temperature measuring unit 62, the dielectric constant calculating unit 63, and the composition ratio derivation unit 64 constitute a composition ratio estimation device 100.

The ranging unit 61 is a functional unit configured to measure the distance between the transmitting-receiving unit 10 and the reference object 21 and the distance between the transmitting-receiving unit 10 and the liquid surface of the liquid 40 based on the radar signals of the reflected waves acquired at the transmitting-receiving unit 10. For the measuring method, an appropriate method, such as a frequency modulated continuous wave, is applicable. Note that the value obtained at the ranging unit 61 is a value measured with no consideration of the dielectric constant of the space 31 and is sometimes different from an actual physical distance.

The temperature measuring unit 62 is a functional unit configured to measure the temperature in the inside of the tank 30 and measure the level at which a predetermined temperature is reached in the inside of the tank 30. A predetermined temperature is the boiling point of each of substances contained in the content. The temperature measuring unit 62 finds the location in the height direction in the tank 30 at which a substance changing into a gas component and a liquid component in the space 31 is reached at its boiling point in the tank 30. In the case in which there is a plurality of substances changing into a gas component and a liquid component in the space 31, the individual locations are found at which the boiling points of the individual substances are reached. Note that the temperature measuring unit 62 may be a temperature sensor placed in the tank 30 or may be a functional unit configured to receive temperature information from a temperature sensor separately disposed from the liquid level gauge 1 and the composition ratio estimation device 100.

The dielectric constant calculating unit 63 is a functional unit configured to calculate the dielectric constant of the space between the transmitting-receiving unit 10 and the reference object 21 (in the following, also referred to as "a transmitting-receiving unit-reference object space 32"). The dielectric constant may be calculated as a relative dielectric constant. The dielectric constant calculating unit 63 stores the physical distance between the transmitting-receiving unit 10 and the reference object 21 in advance, and calculates the dielectric constant of the transmitting-receiving unit-reference object space 32 based on the difference between the physical distance and the measured value obtained at the ranging unit 61. The dielectric constant of the transmitting-receiving unit-reference object space 32 varies depending on substances floating in the space 31, and the distance expressed by the measured value measured from the radar wave varies depending on the dielectric constant. On the other hand, since the physical distance from the transmitting-receiving unit 10 to the reference object 21 is known, the physical distance is compared with the measured value, and hence the mean dielectric constant of the transmitting-receiving unit-reference object space 32 can be calculated.

The composition ratio derivation unit 64 is a functional unit configured to derive the composition ratio of substances contained in the liquid 40 based on the dielectric constant of the transmitting-receiving unit-reference object space 32 obtained at the dielectric constant calculating unit 63, the measured value of the distance from the transmitting-receiving unit 10 to the liquid 40, and locations at which the boiling points of the substances contained in the content are reached in the tank 30.

Here, the technical background that the composition ratio derivation unit 64 derives the composition ratio will be described. The dielectric constant of the space 31 is formed in which the dielectric constants of substances floating in a gas state or a liquid state in the space 31 are combined corresponding to the composition ratio. The dielectric constant of a substance varies depending on the gas state and the liquid state. Here, the layer thicknesses of the gas component and the liquid component are found from the locations of the boiling points found at the temperature measuring unit 62. Therefore, the composition ratio derivation unit 64 stores the dielectric constant in the gas state and the dielectric constant in the liquid state of each of a plurality of substances contained in the content, and derives the composition ratio of the content such that the dielectric constant of the transmitting-receiving unit-reference object space 32 is achieved when the dielectric constants of the floating substances are combined based on the layer thicknesses. Note that as described above, the dielectric constant of the transmitting-receiving unit-reference object space 32 is regarded as equal to the dielectric constant of the space 31.

In the case in which the composition ratio is derived where two kinds of substances (pure substances) are contained in the liquid 40 or it is regarded to contain two kinds of substances, the sum of the composition ratios of these two kinds of substances or the sum of the composition ratios of the substances that are regarded as two kinds is one. Therefore, the composition ratios of two kinds of substances can be derived using the layer thicknesses of the gas component and the liquid component of the substances contained in the content in the tank 30, the dielectric constant of the transmitting-receiving unit-reference object space 32 at the liquid level at a certain location, and the fact that the sum of the composition ratios is one.

In the case in which the composition ratio is derived where three kinds or more of substances (pure substances) are contained in the content or the number of kinds of contained substances is regarded as a certain number that is three kinds or more, the composition ratio derivation unit 64 derives the composition ratio of the liquid 40 using the dielectric constants of the transmitting-receiving unit-reference object space 32 measured at different liquid levels. Specifically, the composition ratio derivation unit 64 records the dielectric constants of the transmitting-receiving unit-reference object space 32 at different liquid levels, measured values at the liquid levels at that time, and locations at which the boiling points of the substances contained in the content are reached in the tank 30, and estimates the composition ratio of the liquid 40 based on these values. According to the present configuration, the composition ratios of three kinds or more of substances can be individually estimated based on the measured values. Also in this case, the sum of the composition ratios of the substances contained in the content is one, and the fact can be used for derivation. Therefore, in the case in which the composition ratios of N kinds of substances are derived, the composition ratios can be derived using values at N−1 liquid levels that are different from each other.

Note that in the case in which a plurality of reference objects 21 is disposed at levels different from each other, the composition ratio derivation unit 64 acquires the dielectric constant of the transmitting-receiving unit-reference object space obtained at a certain liquid level in multiple numbers corresponding to the number of the reference objects 21. Note that it is unnecessary to always find the dielectric constant of the transmitting-receiving unit-reference object space on all a plurality of reference objects 21. There may be a form that finds the dielectric constant of the transmitting-receiving unit-reference object space on anyone or a plurality of reference objects alone. The composition ratio derivation unit 64 may record a plurality of dielectric constants of the transmitting-receiving unit-reference object space, the measured values at the liquid levels, and the measured values of distances between the transmitting-receiving unit 10 and each of the reference objects 21, and estimate the composition ratio of the liquid 40. According to the present configuration, also in the case in which the composition ratio is derived where three kinds or more of substances (pure substances) are contained in the content or the number of kinds of contained substances is regarded as a certain number that is three kinds or more, the composition ratios of individual components can be derived at transmission and reception at one time. Therefore, in the case in which the composition ratios of N kinds of substances are derived, the composition ratios can be derived using N−1 reference objects disposed at levels different from each other for measurement.

The liquid level calculating unit 80 is a functional unit configured to calculate the liquid level of the liquid 40 in the tank 30 based on the radar wave reflected off the liquid surface and the composition ratio of the content. Specifically, the dielectric constant of the space between the transmitting-receiving unit 10 and the liquid surface is calculated based on the composition ratio of the content, the distance calculated from the dielectric constant using the radar wave reflected off the liquid surface, and hence the liquid level of the liquid 40 can be accurately calculated.

The estimated liquid level of the liquid 40 is displayed on a display appropriately included in the composition ratio estimation device 100 or displayed on another device that is electrically connected. Note that the display form may be an appropriate form that users easily understand. The form may be the liquid level of the liquid 40, or the level may be converted into the liquid amount for display. Note that an information notification method may be an appropriate method, such as notification by sound.

Flowchart of Estimating the Composition Ratio of the Liquid 40

Figure 3:
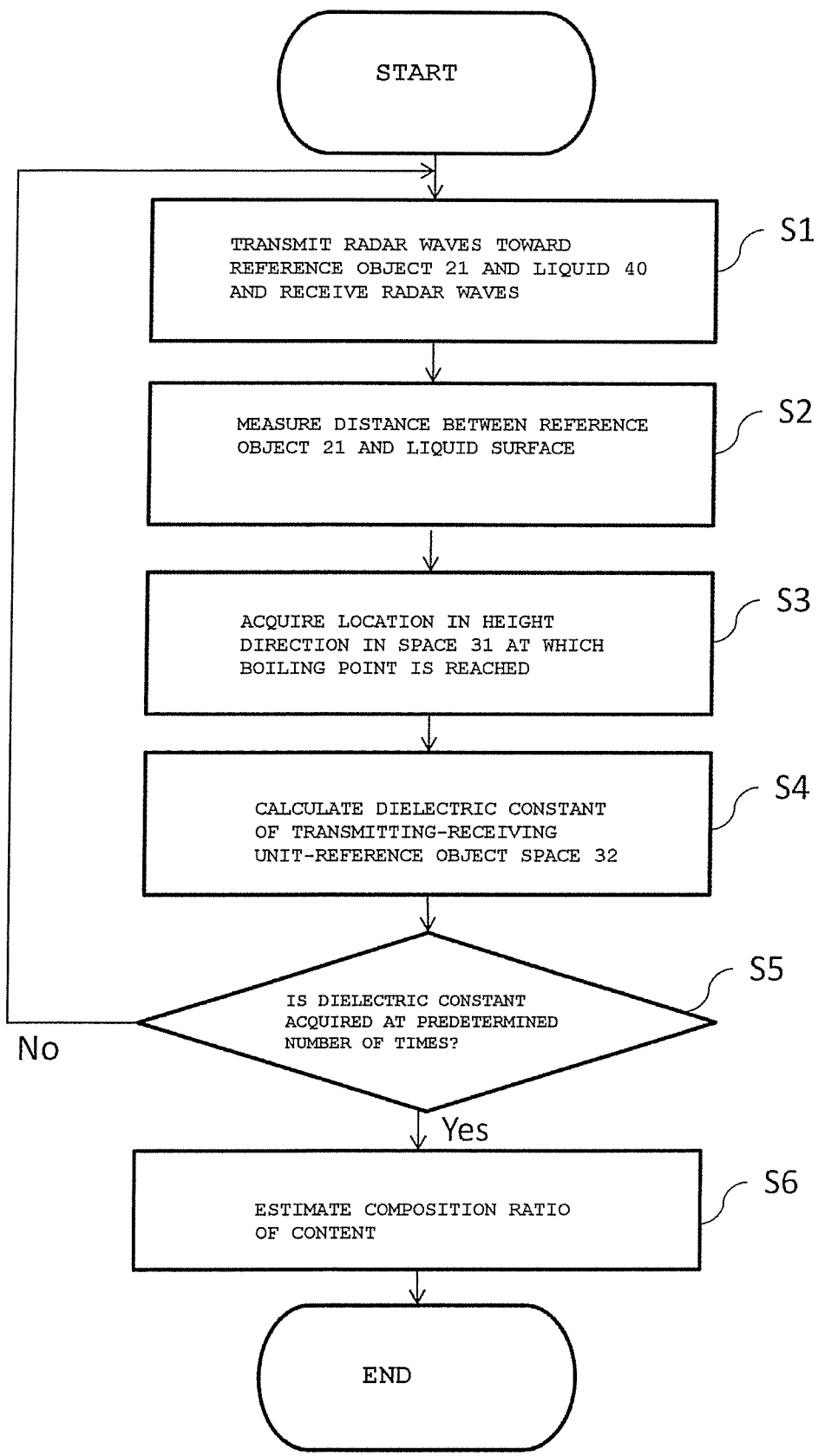
FIG. 3 is a flowchart of a composition ratio derivation unit of the liquid level gauge deriving the composition ratio of a content.

As shown in FIG. 3, first, the transmitting-receiving unit 10 transmits radar waves toward the reference object 21 and the liquid 40, and receives radar waves reflected off the reference object 21 and the liquid surface of the liquid 40 (Step S1).

The ranging unit 61 measures the distance between the transmitting-receiving unit 10 and the reference object 21 and the distance between the transmitting-receiving unit 10 and the liquid surface of the liquid 40 based on the received radar waves (Step S2).

The temperature measuring unit 62 acquires the temperature profile of the space 31 in the tank 30 (Step S3). More specifically, in the case in which the temperature profile of the space 31 is acquired and the temperature profile includes the boiling points of substances contained in the content, the level at which the boiling point is reached is found for the individual substances. Note that Steps S2 and S3 are performed in no particular order, and may be simultaneously performed.

The dielectric constant calculating unit 63 makes reference to the physical distance between the transmitting-receiving unit 10 and the reference object 21 stored in advance and the measured distance measured in Step S2, and the level at which the boiling point is reached acquired in Step S3, and calculates the dielectric constant of the transmitting-receiving unit-reference object space 32 based on the radar signal of the reflected wave from the reference object 21 acquired at the transmitting-receiving unit 10 (Step S4).

The composition ratio derivation unit 64 stores the dielectric constant of the transmitting-receiving unit-reference object space 32. The composition ratio derivation unit 64 can store a plurality of dielectric constants of the transmitting-receiving unit-reference object space 32. In the following, in this paragraph, an example of procedures of automatically acquiring the dielectric constant of the transmitting-receiving unit-reference object space 32 at liquid levels different from each other will be described. For example, the composition ratio derivation unit 64 stores in advance the number of stored dielectric constants that are necessary to derive the composition ratio, and determines whether the specified number of dielectric constants of the transmitting-receiving unit-reference object space 32 at the liquid levels different from each other is acquired and stored (Step S5). In the case in which the specified number of the dielectric constants is acquired, the process goes to Step S6. In the case in which the stored dielectric constant is below the specified number, the process returns to Step S1. Step S1 may be performed at every predetermined time interval, or may be performed in response to another trigger. A configuration may be provided in which Steps S1 and S2 are performed at every predetermined time interval, it is determined whether the liquid level varies by a predetermined value or more by comparison with the liquid level measured in the past, and Step S3 is performed in the case in which the liquid level varies by a predetermined value or more. According to the configuration, a change in the liquid level is detected, and the dielectric constants of the transmitting-receiving unit-reference object space 32 at the liquid levels different from each other can be automatically acquired.

The composition ratio derivation unit 64 makes reference to the radar wave reflected off the reference object 21 and the dielectric constant of the transmitting-receiving unit-reference object space 32, and derives the composition ratio of the content (Step S6).

Note that in the case in which a plurality of reference objects 21 is disposed at the levels different from each other, reference is made to dielectric constants to a plurality of reference objects at a certain liquid level location, and the composition ratio of the content is derived, instead of the results measured at a plurality of times at liquid levels different from each other.

In the liquid level gauge 1 configured to calculate the liquid level of the liquid 40, subsequent to Step S5, the liquid level calculating unit 80 calculates the liquid level of the liquid 40 based on the radar wave reflected off the liquid surface of the liquid 40 and the composition ratio of the content.

According to the present configuration, the composition ratio of the content retained in the tank can be highly accurately estimated. The liquid level can be more accurately measured based on the estimated composition ratio of the content.

What is claimed is:

1. A composition ratio estimation device that estimates a composition ratio of a content retained in an inside of a tank, the content having a plurality of substances mixed, the plurality of substances having boiling points different from each other, wherein
the content is retained as a liquid in a lower part of the inside of the tank, and at least a part of the plurality of substances is floatable as a gas or a liquid in a space in an upper part of the inside of the tank, and
the composition ratio estimation device includes
a reference object disposed in the space,
a transmitting-receiving unit configured to transmit radar waves toward the reference object and a liquid surface of the liquid and receive radar waves reflected off the reference object and the liquid surface,
a temperature measuring unit configured to acquire a level at which a boiling point of a floating substance is reached for individual floating substances floating as a gas and a liquid in the space,
a dielectric constant calculating unit configured to store in advance a physical distance between the transmitting-receiving unit and the reference object and calculate a dielectric constant of a space between the transmitting-receiving unit and the reference object based on the physical distance and the radar wave reflected off the reference object, and
a composition ratio derivation unit configured to derive a composition ratio of the liquid based on the dielectric constant of the space between the transmitting-receiving unit and the reference object and the location of the boiling point.

2. The composition ratio estimation device according to claim 1, wherein
the dielectric constant calculating unit records a measured value of a liquid level of the liquid measured at liquid levels different from each other and a measured value of a distance between the transmitting-receiving unit and the reference object at that liquid level, and
the composition ratio derivation unit estimates a composition ratio of the liquid based on a plurality of measured values of liquid levels of the liquid, and a plurality of measured values of distances between the transmitting-receiving unit and the reference object at that liquid level.

3. The composition ratio estimation device according to claim 1, wherein
the dielectric constant calculating unit calculates a measured distance between the transmitting-receiving unit and the reference object based on a radar wave reflected off the reference object, and calculates a dielectric constant of a space between the transmitting-receiving unit and the reference object based on a difference between the physical distance and the measured distance.

4. The composition ratio estimation device according to claim 1, wherein
the composition ratio derivation unit stores a dielectric constant of each of a plurality of substances in a gas state and a liquid state, the plurality of substances being contained in the content.

5. The composition ratio estimation device according to claim 1, further comprising a waveguide disposed in the inside of the tank, wherein
the transmitting-receiving unit transmits a radar wave to an inside of the waveguide.

6. A liquid level gauge that estimates a composition ratio of a content retained in an inside of a tank, the content having a plurality of substances mixed, the plurality of substances having boiling points different from each other, the liquid level gauge comprising:
a composition ratio estimation device including a transmitting-receiving unit configured to transmit a radar wave toward a liquid surface of the liquid and receive a radar wave reflected off the liquid surface, the composition ratio estimation device being configured to estimate a composition ratio of the content; and
a liquid level calculating unit configured to estimate a liquid level of the content based on a radar wave reflected off the liquid surface of the liquid and the composition ratio of the content, wherein
the composition ratio estimation device is the composition ratio estimation device according to claim 1.

7. A composition ratio estimation device that estimates a composition ratio of a content retained in an inside of a tank, the content having a plurality of substances mixed, the plurality of substances having boiling points different from each other, wherein
the content is retained as a liquid in a lower part of the inside of the tank and a part of the plurality of substances is floatable as a gas or a liquid in a space in an upper part of the inside of the tank,
the composition ratio estimation device includes
a plurality of reference objects disposed in the space,
a transmitting-receiving unit configured to transmit radar waves toward the plurality of reference objects and a liquid surface of the liquid and receive radar waves reflected off the plurality of reference objects and the liquid surface,
a temperature measuring unit configured to acquire a location in a height direction at which a boiling point of a substance is reached for individual substances floating as a gas and a liquid in the space,
a dielectric constant calculating unit configured to store in advance a physical distance between the transmitting-receiving unit and the reference object and calculate a dielectric constant of a space between the transmitting-receiving unit and the plurality of reference objects individually based on the physical distance and the radar wave reflected off the reference object, and
a composition ratio derivation unit configured to derive a composition ratio of the liquid based on the dielectric constants of the space between the transmitting-receiving unit and the plurality of reference objects and the location of the boiling point,
the dielectric constant calculating unit records a measured value of a liquid level of the liquid and a measured value of a distance between the transmitting-receiving unit and the plurality of reference objects individually, and
the composition ratio derivation unit estimates a composition ratio of the liquid based on the dielectric constants calculated at the dielectric constant calculating unit.

8. The composition ratio estimation device according to claim 7, wherein
the dielectric constant calculating unit calculates a measured distance between the transmitting-receiving unit and the reference object based on a radar wave reflected off the reference object, and calculates a dielectric constant of a space between the transmitting-receiving unit and the reference object based on a difference between the physical distance and the measured distance.

9. The composition ratio estimation device according to claim 7, wherein
the composition ratio derivation unit stores a dielectric constant of each of a plurality of substances in a gas state and a liquid state, the plurality of substances being contained in the content.

10. The composition ratio estimation device according to claim 7, further comprising a waveguide disposed in the inside of the tank, wherein
the transmitting-receiving unit transmits a radar wave to an inside of the waveguide.

11. A liquid level gauge that estimates a composition ratio of a content retained in an inside of a tank, the content having a plurality of substances mixed, the plurality of substances having boiling points different from each other, the liquid level gauge comprising:
a composition ratio estimation device including a transmitting-receiving unit configured to transmit a radar wave toward a liquid surface of the liquid and receive a radar wave reflected off the liquid surface, the composition ratio estimation device being configured to estimate a composition ratio of the content; and
a liquid level calculating unit configured to estimate a liquid level of the content based on a radar wave reflected off the liquid surface of the liquid and the composition ratio of the content, wherein
the composition ratio estimation device is the composition ratio estimation device according to claim 7.

12. A composition ratio estimation method of estimating a composition ratio of a content retained in an inside of a tank, the content having a plurality of substances mixed, the plurality of substances having boiling points different from each other, wherein
the content is retained as a liquid in a lower part of the inside of the tank, and at least a part of the plurality of substances is floatable as a gas or a liquid in a space in an upper part of the inside of the tank, and
the method includes the steps of
transmitting radar waves from a transmitting-receiving unit toward a reference object disposed in the space and a liquid surface of the liquid, and receiving radar waves reflected off the reference object and the liquid surface,
acquiring a location at which a boiling point of a floating substance floating as a gas and a liquid in the space is reached,
storing in advance a physical distance between the transmitting-receiving unit and the reference object to calculate a dielectric constant of a space between the transmitting-receiving unit and the reference object based on the physical distance and a radar wave reflected off the reference object, and
deriving a composition ratio of the liquid based on the dielectric constant of the space between the transmitting-receiving unit and the reference object and the location at which the boiling point is reached.

13. A non-transitory computer readable recording medium storing a composition ratio estimation program that estimates a composition ratio of a content retained in an inside of a tank, the content having a plurality of substances mixed, the plurality of substances having boiling points different from each other, wherein
the content is retained as a liquid in a lower part of the inside of the tank, and at least a part of the plurality of substances is floatable as a gas or a liquid in a space in an upper part of the inside of the tank,
the program causes a computer to execute the instructions of
transmitting radar waves from a transmitting-receiving unit toward a reference object disposed in the space and a liquid surface of the liquid and receiving radar waves reflected off the reference object and the liquid surface,
acquiring a location at which a boiling point of a floating substance floating as a gas and a liquid in the space is reached,
storing in advance a physical distance between the transmitting-receiving unit and the reference object to calculate a dielectric constant of a space between the transmitting-receiving unit and the reference object based on the physical distance and a radar wave reflected off the reference object, and deriving a composition ratio of the liquid based on the dielectric constant of the space between the transmitting-receiving unit and the reference object and the location of the boiling point.

\* \* \* \* \*